(12) United States Patent
Lu et al.

(10) Patent No.: US 9,318,696 B2
(45) Date of Patent: Apr. 19, 2016

(54) SELF-ALIGNED TOP CONTACT FOR MRAM FABRICATION

(71) Applicant: QUALCOMM Incorporated, San Diego, CA (US)

(72) Inventors: Yu Lu, San Diego, CA (US); Xia Li, San Diego, CA (US); Seung Hyuk Kang, San Diego, CA (US); Shiqun Gu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 141 days.

(21) Appl. No.: 14/195,566

(22) Filed: Mar. 3, 2014

(65) Prior Publication Data

US 2015/0249209 A1    Sep. 3, 2015

(51) Int. Cl.
*H01L 21/00* (2006.01)
*H01L 43/12* (2006.01)
*H01L 43/08* (2006.01)
*H01L 43/02* (2006.01)
*H01L 27/22* (2006.01)

(52) U.S. Cl.
CPC ............. *H01L 43/12* (2013.01); *H01L 27/222* (2013.01); *H01L 43/02* (2013.01); *H01L 43/08* (2013.01)

(58) Field of Classification Search
CPC ......... H01L 43/12; H01L 43/02; H01L 43/08; H01L 27/222; G01R 33/09
USPC .................................... 257/295, 421; 365/158
See application file for complete search history.

(56) References Cited

U.S. PATENT DOCUMENTS

| | | | |
|---|---|---|---|
| 6,985,384 | B2 | 1/2006 | Costrini et al. |
| 7,381,574 | B2 | 6/2008 | Kim et al. |
| 7,803,639 | B2 | 9/2010 | Assefa et al. |
| 7,884,433 | B2 | 2/2011 | Zhong et al. |
| 8,110,881 | B2 | 2/2012 | Kao et al. |
| 2004/0206725 | A1 | 10/2004 | Fuse et al. |
| 2005/0136678 | A1* | 6/2005 | Chou ............... H01L 21/02063 438/706 |

(Continued)

FOREIGN PATENT DOCUMENTS

EP    1367638 A1    12/2003

OTHER PUBLICATIONS

Partial International Search Report—PCT/US2015/016773—ISA/EPO—May 21, 2015.

(Continued)

*Primary Examiner* — Tu-Tu Ho
(74) *Attorney, Agent, or Firm* — Muncy, Geissler, Olds & Lowe, P.C.

(57) ABSTRACT

Systems and methods for forming precise and self-aligned top metal contact for a Magnetoresistive random-access memory (MRAM) device include forming a magnetic tunnel junction (MTJ) in a common interlayer metal dielectric (IMD) layer with a logic element. A low dielectric constant (K) etch stop layer is selectively retained over an exposed top surface of the MTJ. Etching is selectively performed through a top IMD layer formed over the low K etch stop layer and the common IMD layer, based on a first chemistry which prevents etching through the low K etch stop layer. By switching chemistry to a second chemistry which precisely etches through the low K etch stop layer, an opening is created for forming a self-aligned top contact to the exposed top surface of the MTJ.

19 Claims, 6 Drawing Sheets

Step S200H

(56) References Cited

U.S. PATENT DOCUMENTS

| | | |
|---|---|---|
| 2005/0158882 A1 | 7/2005 | Hwang et al. |
| 2007/0048950 A1 | 3/2007 | Kanakasabapathy et al. |
| 2008/0164617 A1 | 7/2008 | Assefa et al. |
| 2010/0197043 A1 | 8/2010 | Rizzo et al. |
| 2011/0089507 A1 | 4/2011 | Mao |
| 2011/0159202 A1* | 6/2011 | Matsushita ....... H01L 21/76831 427/509 |
| 2011/0183520 A1* | 7/2011 | Cheng ............... H01L 21/02074 438/694 |
| 2012/0228728 A1 | 9/2012 | Ueki et al. |
| 2013/0032907 A1 | 2/2013 | Satoh et al. |
| 2013/0149873 A1* | 6/2013 | Hirose .................... H01L 21/31 438/763 |

OTHER PUBLICATIONS

International Search Report and Written Opinion—PCT/US2015/016773—ISA/EPO—Aug. 20, 2015.

* cited by examiner

CONVENTIONAL ART

FIG. 1

FIG. 2A
Step S200A

FIG. 2B
Step S200B

FIG. 2C
Step S200C

FIG. 2D
Step S200D

FIG. 2E
Step S200E

FIG. 2F
Step S200F

FIG. 2G
Step S200G

FIG. 2H
Step S200H

FIG. 3

SELF-ALIGNED TOP CONTACT FOR MRAM FABRICATION

FIELD OF DISCLOSURE

Disclosed embodiments are directed to a Magnetoresistive Random Access Memory (MRAM) integration. More particularly, exemplary embodiments are directed to processes for forming self-aligned top contacts for magnetic tunnel junction (MTJ) storage elements in MRAM devices, where the processes are compatible with integration of logic elements with the MTJ elements.

BACKGROUND

Magnetoresistive Random Access Memory (MRAM) is a non-volatile memory technology that uses magnetic elements. MRAM is gaining popularity as the next-generation memory technology for numerous semiconductor device applications which require low cost and high speed. Several types of MRAM are well known in the art, and MRAM operation can be briefly explained using the example of a commonly used variety of MRAM, a Spin Transfer Torque MRAM (STT-MRAM). A STT-MRAM uses electrons that become spin-polarized as the electrons pass through a thin film (spin filter).

Figure 1:
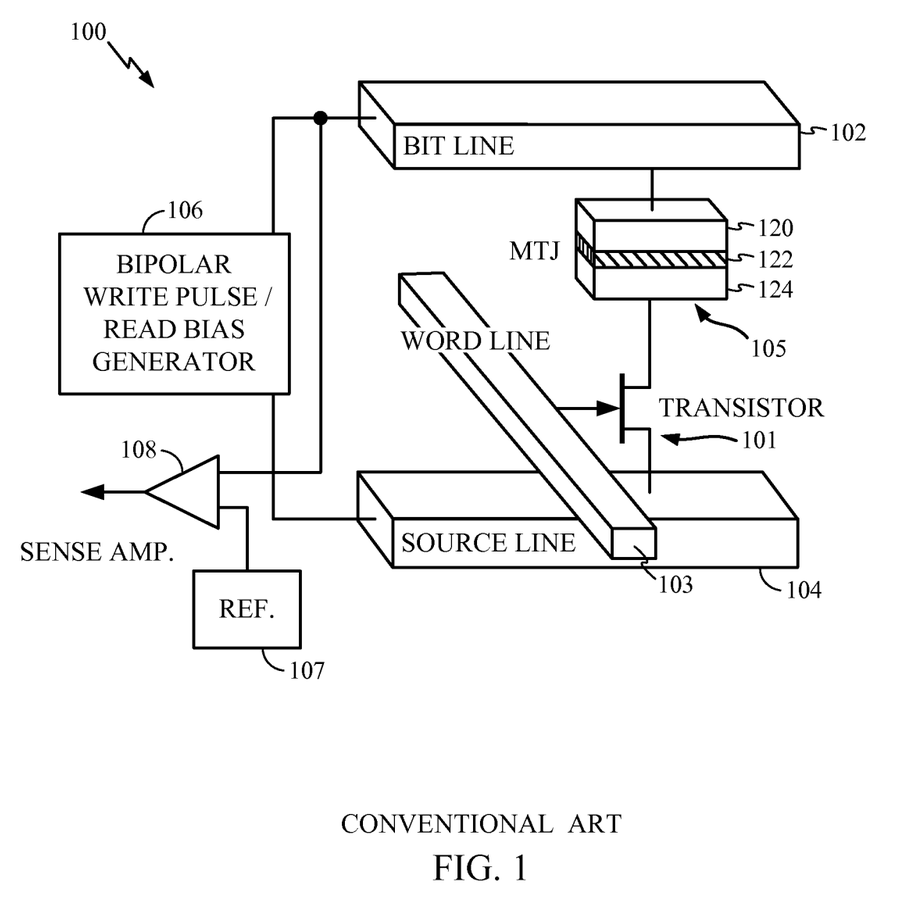
FIG. 1 is an illustration of a conventional MRAM circuit with an MTJ storage element.

FIG. 1 illustrates a conventional STT-MRAM bit cell 100. The STT-MRAM bit cell 100 includes magnetic tunnel junction (MTJ) storage element 105 (also referred to as "MTJ stack" or simply, "MTJ"), transistor 101, bit line 102 and word line 103. MTJ 105 is formed, for example, from pinned layer 124 and free layer 120, each of which can hold a magnetic moment or polarization, separated by insulating tunneling barrier layer 122. There may be an anti-ferromagnetic (AFM) layer and a cap layer (not shown) in MTJ 105. The AFM layer is used to pin the magnetic moment of the pinned layer. The cap layer is used as a buffer layer between the MTJ and metal interconnects. The polarization of the free layer can be reversed by applying current in a specific direction such that the polarity of the pinned layer and the free layer are either substantially aligned or opposite. The resistance of the electrical path through the MTJ varies depending on the alignment of the polarizations of the pinned and free layers. This variation in resistance can be used to program and read STT-MRAM bit cell 100, as is known. STT-MRAM bit cell 100 also includes circuit elements, source line 104, sense amplifier 108, read/write circuitry 106 and bit line reference 107. Those skilled in the art will appreciate the operation and construction of STT-MRAM bit cell 100 as known in the art.

As seen from the above example, the fabrication of a conventional STT-MRAM bit cell involves integration of the various above-described components on a circuit board or semiconductor package. More specifically, memory or storage elements (e.g., MTJ 105) must be integrated with various other circuit elements (generally referred to herein, as, "logic elements") such as, passive components, metal wires, transistors, logic gates, etc. In general, such integration requires process compatibility between the memory elements and the logic elements. Several challenges arise in this area, particularly as device technology continues to advance towards smaller and smaller device sizes.

For example, during the fabrication of MRAM devices such as STT-MRAM bit cell 100, it is important to ensure that capacitance of various components C and resistance R of various components and connections are maintained at low values. This is important for reducing cross coupling and RC delay values. Specifically, it is important to ensure low resistance contacts to MTJ 105, for example, to make connections to bit line 102 and transistor 101. It is also important to ensure that the process of making such contacts does not negatively impact capacitance of other circuit components that reside in a common dielectric layer (e.g., a common interlayer metal dielectric (IMD) layer) where MTJ 105 is formed.

Ensuring low resistance contacts, particularly to the top portion of MTJ 105, for example to couple free layer 120 to bit line 102, tends to be challenging, particularly as device technology advances and the height of MTJ 105 shrinks below 100 nm. Such extreme restrictions on MTJ sizes is seen, for example, in embedded applications where MTJ 105 would be required to fit between two adjacent metal levels, for example, one metal level layer below and one metal layer above MTJ 105, for making connections to the external components such as transistor 101 and bit line 102. Several drawbacks are seen in existing techniques for forming such contacts to MTJs. Some known approaches will be discussed below, for forming a top contact to an MTJ, where the MTJ is formed in a common IMD layer which also comprises other compatible logic elements (e.g., a vertical interconnect access, commonly known as "via"). Metal line contacts may be established in layers above and below this common IMD layer In a first known approach for making a top contact to the MTJ, a top layer above the common IMD layer, where a top metal line can be formed, may be filled with a top IMD layer, up to an expected height of the top metal line. This height may be based, for example, according to a standard back end of line (BEOL) process (a BEOL is a well recognized part of integrated circuit fabrication, which defines specifications related to interconnections for connecting the various circuit elements, such as transistors, capacitors, resistors, etc., which may be formed on-chip). A trench etch process may then be used to create a trench in the top IMD layer to expose a top of the MTJ in the common IMD layer, following which the top metal line may be deposited in the trench to form a contact with the MTJ.

In a second known approach, a chemical mechanical polishing (CMP) or other planarization techniques may be used to expose the top of the MTJ formed in the common IMD layer. A top electrode (TE) can then be formed as a separate structure on top of the MTJ, for example, by deposition and patterning of a metal layer. A top IMD layer can be filled on top of the common IMD layer and a standard double-damascene (DD) process can be used to etch the top IMD layer with the TE as an etch stop layer to create a trench which ends on the TE on top of the MTJ.

In a third known approach, a sacrificial mandrel in the form of a non-conductive hard mask (HM) layer may be created on top of the MTJ. The sacrificial HM layer may be serve to protect the MTJ during etching, as well as, provide a means for forming an electrical connection to the MTJ. Once again, a top IMD layer may be filled to the height of the top metal line, and a trench etch can be performed to expose the sacrificial mandrel HM. The sacrificial mandrel HM may be selectively removed to form a cavity. The cavity may be filled during a standard BEOL process for forming the top metal line.

In a fourth known approach, the top IMD layer may be filled to a same level as for standard BEOL process, as in the first known approach above, for example. Following this, a small via may be patterned over the MTJ, such that the small via is contained within a lateral boundary of the MTJ (or in other words, limited to the width of the MTJ's horizontal surface area). Top contacts can be established through this small via.

Each of the above four known approaches require critical mask level or process steps for forming the MTJ contacts (e.g., the precise trench etches using the MTJ top, TE, HM, etc as etch stop layer). These critical masks and precise etch processes are expensive and add process complexity. Further, these known approaches do not scale well, and thus, are not compatible with projected physical dimension scaling for standard BEOL or MTJ for future technologies.

In yet another known approach, a layer formed of a high dielectric constant (K), such as, silicon nitride (SiN), is formed on top of the MTJ, as well as, the logic elements in the common IMD layer. This high K SiN layer is used as an etch stop layer, such that the top IMD layer is filled over this etch stop layer, and then trench etching is performed up to the etch stop layer on the MTJ side and past the etch stop layer, with a controlled etch to through the common IMD layer to form connections to layers below the common IMD layer on the logic side. However, such an approach tends to increase the parasitic capacitance (and thus, RC delay) and cross coupling on the logic side due to the presence of the high K SiN etch stop layer in the vicinity of the logic elements and the MTJ, which is undesirable.

Accordingly, there is a need in the art for avoiding the aforementioned drawbacks of known approaches for MRAM fabrication, for example, with regard to forming top contacts for MTJs.

SUMMARY

Exemplary embodiments are directed to systems and methods for forming self-aligned top contacts for MTJ elements in MRAM devices.

For example, an exemplary embodiment is directed to a method for forming precise and self-aligned top metal contact for a Magnetoresistive random-access memory (MRAM) device include forming a magnetic tunnel junction (MTJ) in a common interlayer metal dielectric (IMD) layer with a logic element. A low dielectric constant (K) etch stop layer is selectively retained over an exposed top surface of the MTJ. Etching is selectively performed through a top IMD layer formed over the low K etch stop layer and the common IMD layer, based on a first chemistry which prevents etching through the low K etch stop layer. By switching chemistry to a second chemistry which precisely etches through the low K etch stop layer, an opening is created for forming a self-aligned top contact to the exposed top surface of the MTJ.

Another exemplary embodiment is directed to a Magnetoresistive random-access memory (MRAM) device comprising: a magnetic tunnel junction (MTJ) formed in a common interlayer metal dielectric (IMD) layer with a logic element, and a low dielectric constant (K) etch stop layer formed selectively over the MTJ, but not the logic element, wherein the low K etch stop layer is configured to be etched by a second chemistry but not affected by a first chemistry used to etch the common IMD layer, and wherein a self-aligned top metal line contact for the MTJ is formed in an opening etched in the low K etch stop layer using the second chemistry.

Yet another exemplary embodiment is directed to a Magnetoresistive random-access memory (MRAM) device comprising a magnetic tunnel junction (MTJ) formed in a common interlayer metal dielectric (IMD) layer with a logic element, and means for selectively preventing etching over the MTJ based on a first chemistry used for etching the common IMD layer, wherein the means is responsive to etching based on a second chemistry, and wherein a self-aligned top metal line contact for the MTJ is formed in an opening etched in the means, using the second chemistry.

BRIEF DESCRIPTION OF THE DRAWINGS

The accompanying drawings are presented to aid in the description of embodiments of the various embodiments and are provided solely for illustration of the embodiments and not limitation thereof.

DETAILED DESCRIPTION

Aspects of the various embodiments are disclosed in the following description and related drawings directed to specific embodiments. Alternate embodiments may be devised without departing from the scope of the invention. Additionally, well-known elements of the various embodiments will not be described in detail or will be omitted so as not to obscure the relevant details of the various embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments are directed to design and fabrication of MRAM, and in some aspects, more specifically to improved integration of MRAM or MTJ elements with logic elements as exemplarily applicable to advanced device technologies. In other words, embodiments include designs and layouts of MTJ elements, which are compatible with future device technologies with extremely small and ever shrinking dimensions (e.g., 20 nm, 16 nm, 10 nm, and so on . . . ). However, it will be understood that exemplary embodiments are not to be construed as limited to any particular device technology, current, or future, but on the other hand, the embodiments represent efficient solutions for improved utilization of space and area in integrated circuits or semiconductor devices comprising MRAM integration.

Exemplary embodiments overcome the drawbacks of known approaches in MRAM fabrication, to provide simple and scalable solutions for forming top contacts to MTJ elements, while avoiding undesirable increase in capacitance, cross coupling, RC delays, etc. In this regard, some embodiments include formation of an exemplary low K etch stop layer on top of a common IMD layer comprising an MTJ and logic elements. The exemplary low K etch stop layers are not affected by conventional etching chemistries which are used for etching IMD layers such as the common IMD layer or a top IMD layer formed on top of the low K etch stop layer. Thus, forming the low K etch stop layer on top of the MTJ element allows etching to be performed using a first chemistry, for example, to etch away the common IMD layer, and elements on the logic side; however, the low K etch stop layer remains unaffected by the first chemistry. The etching chemistry can then be switched to a second chemistry which allows precisely etching through the low K etch stop layer, thus creating an opening that lands precisely over a top surface of the MTJ. A self-aligned top contact can thus be formed for the MTJ through this opening.

The IMD layers such as, the common IMD and the top IMD layer, for example, are usually formed from silicon oxide, porous carbon doped silicon oxide or other porous low-K materials, which are affected by conventional switching chemistries (referred to, herein, as a first chemistry), such as, C4F6 or C4F8 based chemistries, which may also include Nitrogen (N2) and Argon (Ar) mixed in. The exemplary low K etch stop layer can be formed of insulating materials such as silicon carbon nitride (SiCN) or nitrogen doped silicon carbide, commonly known as nBlok, which are not affected by conventional etching chemistries or the first chemistry, but can only be selectively etched using special chemistries (referred to herein, as a second chemistry), such as, Ch3F or CF4 based chemistry, which may also include N2 and Ar mixed in. Adding Hydrogen (H2) to Fluorocarbon chemistry is known to change the balance of Fluorocarbon polymer generation and removal, which can be employed to tune etch selectivity between silicon, oxide, nitride, and carbide materials. Such low K etch stop layers have a K value around 6.0, which tends to be lower than the K value of typical silicon nitride (which is higher than 7.0), and prevents increase in capacitance, cross-coupling, etc. In some aspects, the low K etch stop layer can be selectively formed on the MTJ side, or in other words, selectively removed from the logic side comprising logic elements in the common IMD layer, prior to formation of the top IMD layer. In alternative aspects, the low K etch stop layer can consist of other known dielectric materials or combination of materials known in the art, such as, carbon doped silicon oxide, which have dielectric constants in the range of 2.5 to 3.5, and have relatively low etch rates in typical silicon oxide etch chemistry. In this manner, the capacitance contribution by the low K etch stop layer to the logic side is further reduced.

With reference now to FIGS. 2A-H cross-sectional views for an exemplary process steps S200A-H respectively, and related components, for formation of an exemplary MRAM device 200 are illustrated. More specifically, FIG. 2H formed in step S200H represents a complete view of MRAM device 200 according to an exemplary embodiment, and the following explanation will be provided for a step by step process of reaching the embodiment depicted in FIG. 2H.

Figure 2A:
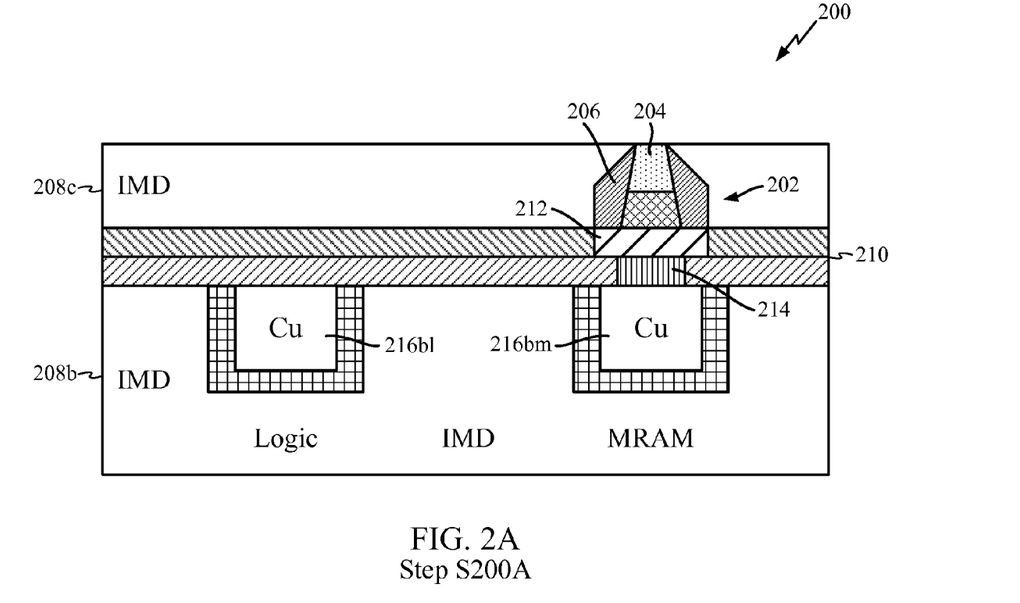
FIGS. 2A-H illustrate cross-sectional views for an exemplary process steps S200A-H respectively, and related components, for formation of an exemplary MRAM device 200.

Accordingly, with reference to FIG. 2A, an initial view of MRAM device 200 formed in step 200A is illustrated, for purposes of this explanation. In general, components of MRAM device 200 are separately shown under a "logic" side on the left hand side and "MRAM" side on the right hand side. The logic side pertains to circuit elements and components, representatively formed by vias and/or metal lines, in addition to semiconductor devices not shown in the figure, and may be collectively referred to as "logic elements." On the other hand, the MRAM side includes MTJ 202 and related components for formation of contacts to the MTJ, and may be collectively referred to as "MRAM elements." Exemplary aspects include integration of MRAM elements compatible with formation of logic elements.

In more detail, MTJ 202 can include hard mask (HM) 204 and protective side cap 206 in common IMD layer 208c, although it will be understood that HM 204 and side cap 206 are optional features that need not be present in some exemplary embodiments. One or more cap layers 210 separate common IMD layer 208c from bottom IMD layer 208b. Bottom IMD layer comprises bottom metal lines 216b1 on the logic side and 216bm on the MRAM side. The bottom metal lines are exemplarily made of copper (Cu). MTJ 202 is coupled to bottom electrode (BE) 212, shown to be formed within one of cap layers 210, and coupled to bottom metal line 216bm through BE contact 214 formed within another one of cap layers 210.

Briefly, step 200A for arriving at the initial view of MRAM device 200 in FIG. 2A involves forming the bottom IMD layer 208b, etching and metalizing to form bottom metal lines 216b1 and 216bm, depositing one or more cap layers 210, etching the one or more cap layers for formation of BE contact 214 and BE 212, and depositing layers (e.g., pinned layer, barrier layer, and free layer) of MTJ 202, and forming HM 204. MTJ 202 is then patterned, and following passivation and oxidation, side cap 206 is added. Common IMD layer 208c, also of low K dielectric material is filled. A process of planarization is used to expose the top surface of MTJ 202, or rather, the top surface of HM 204, in exemplary aspects.

Figure 2B:
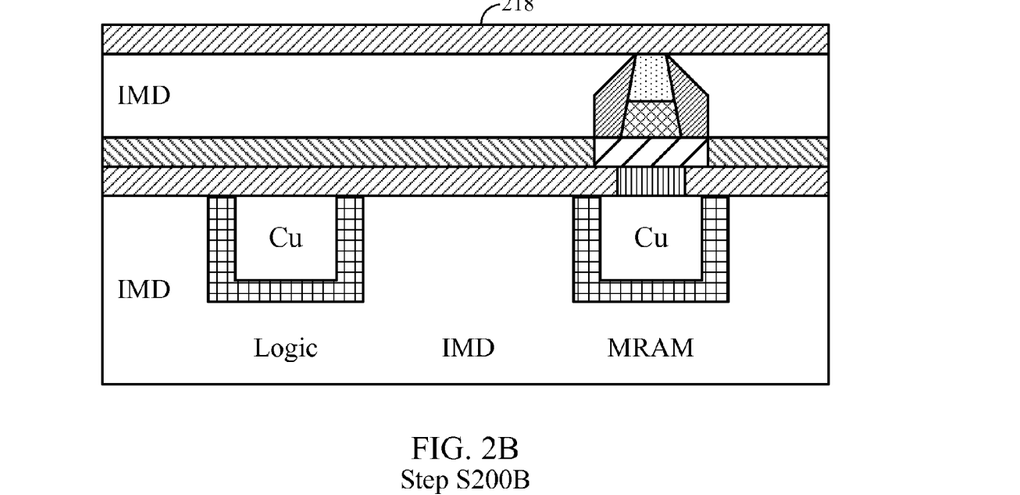

Moving to FIG. 2B, step S200B is illustrated where a dielectric capping layer comprising nBlok or a low K dielectric material is deposited as low K etch stop layer 218, over common IMD layer 208c. Low K etch stop layer 218 can be exemplarily formed by an insulating material, or a low K material, such as, SiCN, or nBlok, which can only be selectively etched with the aforementioned second chemistry, for example, but not by a first chemistry which can etch common IMD layer 208c, for example. As previously mentioned, SiCN has the beneficial property of avoiding undesirable capacitance to a large extent, while also providing an insulating layer to act as an etch stop layer. As discussed previously, prior approaches fail to provide such a low K etch stop layer.

Figure 2C:
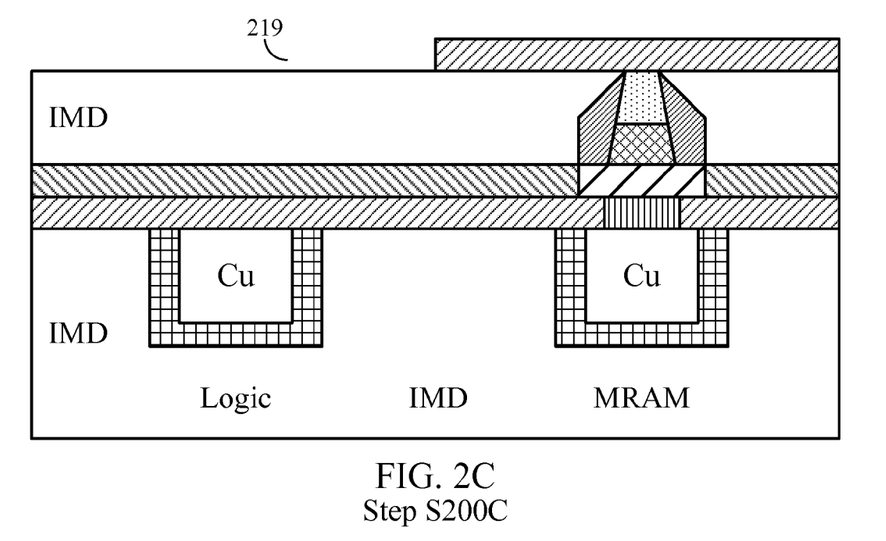

In S200C of FIG. 2C, the low K etch stop layer 218 can be selectively removed from over the logic side, to create void 219, which is free of the etch stop material or SiCN. Creating void 219 offers the beneficial aspect of further reducing capacitance or cross coupling over the logic elements. As previously noted, known prior approaches fail to include a step such as, step S200C, for further reducing capacitance of the logic side.

However, it will be noted that step S200C is optional, and some embodiments may retain low K etch stop layer 218 over the logic side as well, without creating void 219, as this may reduce a process step while still retaining overall low capacitance properties of a SiCN low K etch stop layer, as compared to previously known approaches.

Figure 2D:
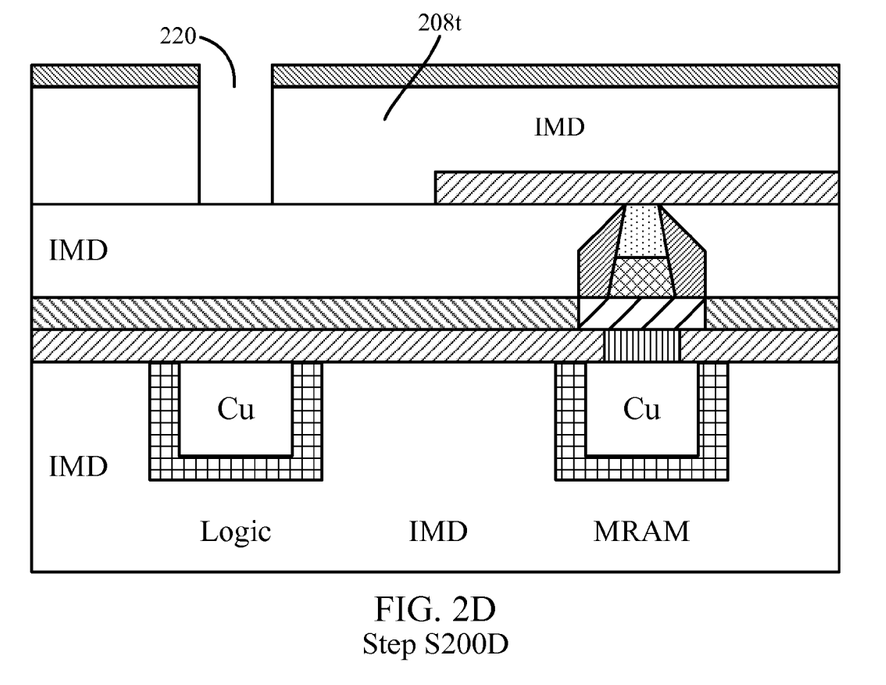

Proceeding to FIG. 2D, step S200D includes filling top IMD layer 208t over low K etch stop layer 218, and a void 220 is etched, for forming a via for the logic side. In exemplary aspects, top IMD layer 208t can be etched using the first chemistry which can be used for etching common IMD layer 208c as noted above. In some optional aspects (not shown), planarization can be performed to fill a planar dielectric around MTJ 202, prior to etching through top IMD layer 208t. Void 220 may be etched, for example, using a timed via etch process, based on the first chemistry.

Figure 2E:
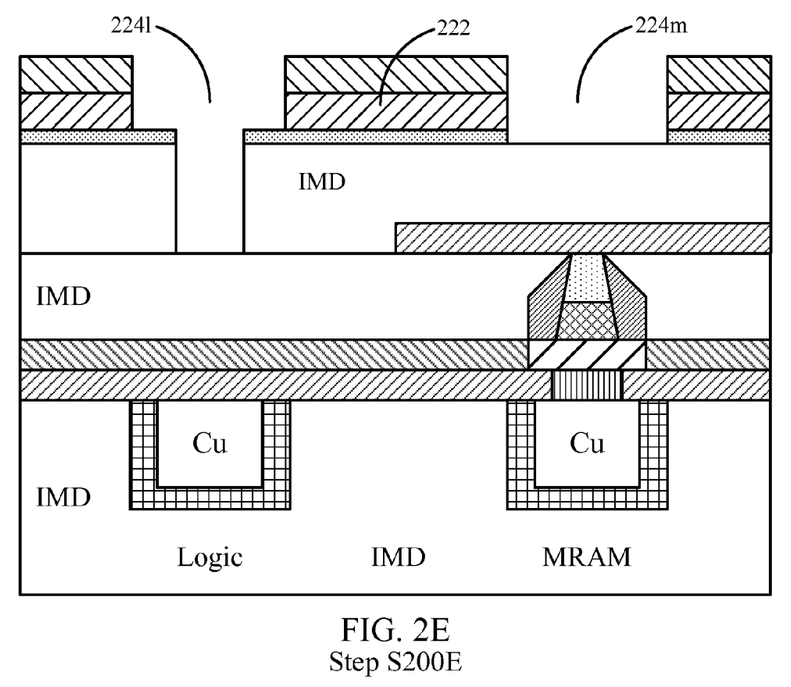

With reference to FIG. 2E, step S200E is shown, where a hard mask or metal layer 222 is deposited to create trench patterns, trench 224l on the logic side, and trench 224m on the MRAM side.

Figure 2F:
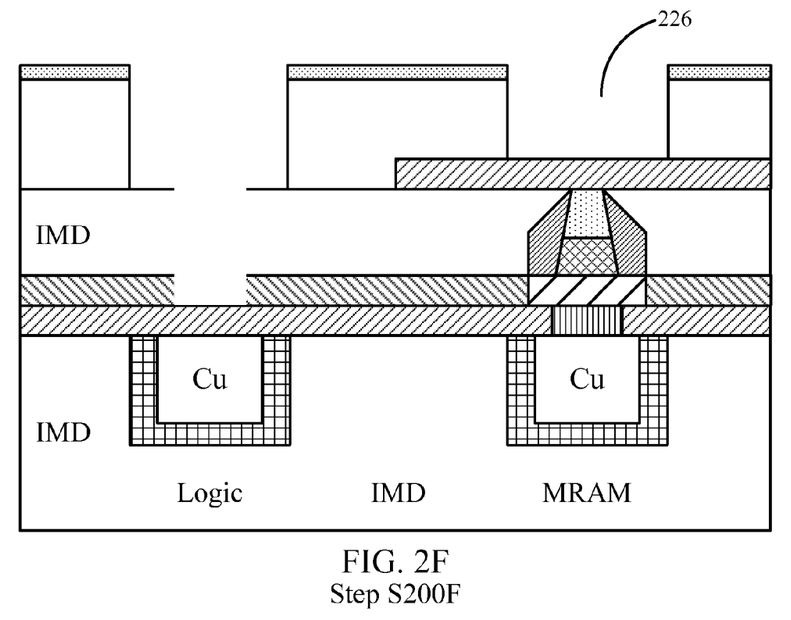

In FIG. 2F, using the patterns for the trenches created in step S200E, step 200F involves etching through the trench patterns, for example, based on the first chemistry. On the MRAM side, etching, based on the first chemistry, through the pattern created by 224m stops at the low K etch stop layer 218, since low K etch stop layer 218 is not affected by the first chemistry. Thus, the need for high precision, low scalability, etch processes of prior known approaches is avoided by using etch stop layers unaffected by conventional etching chemistries. Void 226 is formed in the process. On the logic side, since the low K etch stop layer 218 is missing, the etching proceeds through trench 224l and then through void 220 (formed in FIG. 2D), and stops at one of cap layers 210. In some aspects, the lower one of cap layers 210 can be formed of the same or similar material as the low K etch stop layer 218.

Figure 2G:
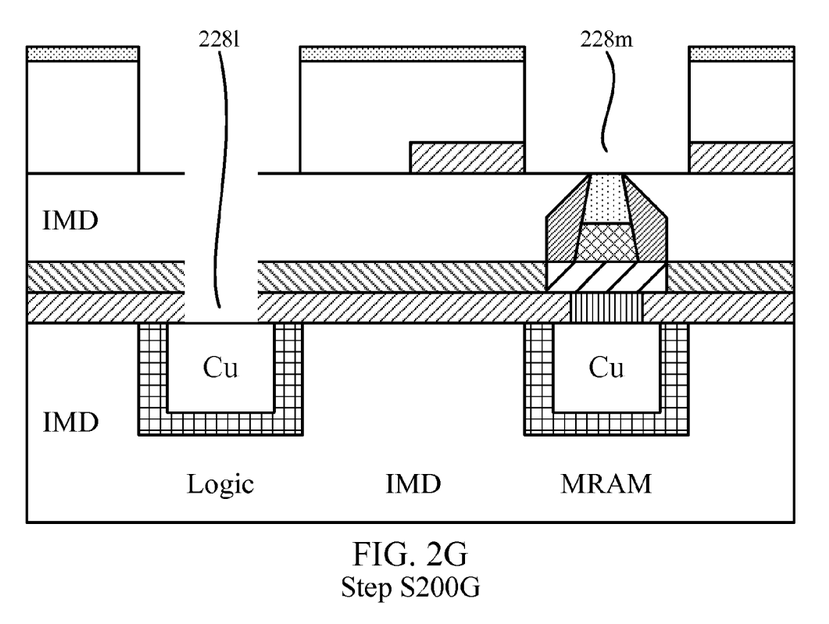

Step s200G of FIG. 2G, involves switching chemistry to the second chemistry and etching through the low K etch stop layer 218 (which has been exposed since top IMD layer 208t was removed previously based on the first chemistry etching), through void 226 on the MRAM side, to provide opening 228m. Opening 228m advantageously exposes HM 204 of MTJ 202. It will be noticed that opening 228m is perfectly aligned to the exposed surface of HM 204 based on the precise removal of the low K etch stop layer 218 using the second chemistry etching. As discussed herein, such alignment of opening 228m to HM 204 is referred to as "self-alignment," or in other words, a self-aligned opening for metallization and contact formation to MTJ 202 is thus created. On the logic side, the switching chemistry and etching leads to removal of the lower of cap layers 210, thus resulting in opening 228l for forming a metal line contact on exposed bottom metal line 216b1.

Figure 2H:
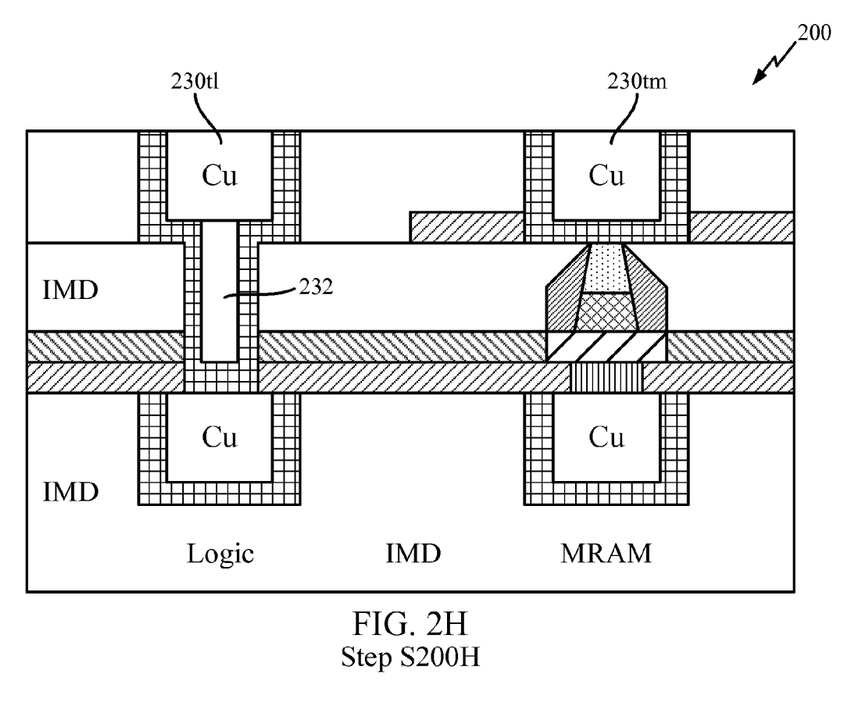

Finally, in FIG. 2H, step s200H is illustrated, where metallization is performed, for example, through a standard dual damascene (DD) process for Copper (Cu) or Copper dual damascene process, used as an exemplary material for forming metal lines. This leads to formation of via 232 and contact on top metal line 230t1 (or "top metal line contact") on the logic side. Whereas on the MRAM side, metallization creates formation of top metal line 200tm which conveniently contacts HM 204, thus forming the desired self-aligned top metal line contact for MTJ 202, without expensive high precision control processes known in prior approaches.

Accordingly, exemplary embodiments can accomplish precise self-aligned top contacts for MRAM devices which are fully compatible with logic processes, while avoiding undesirable expensive high precision control processes, low scalability, and high capacitance, as are known in the previous approaches.

Figure 3:
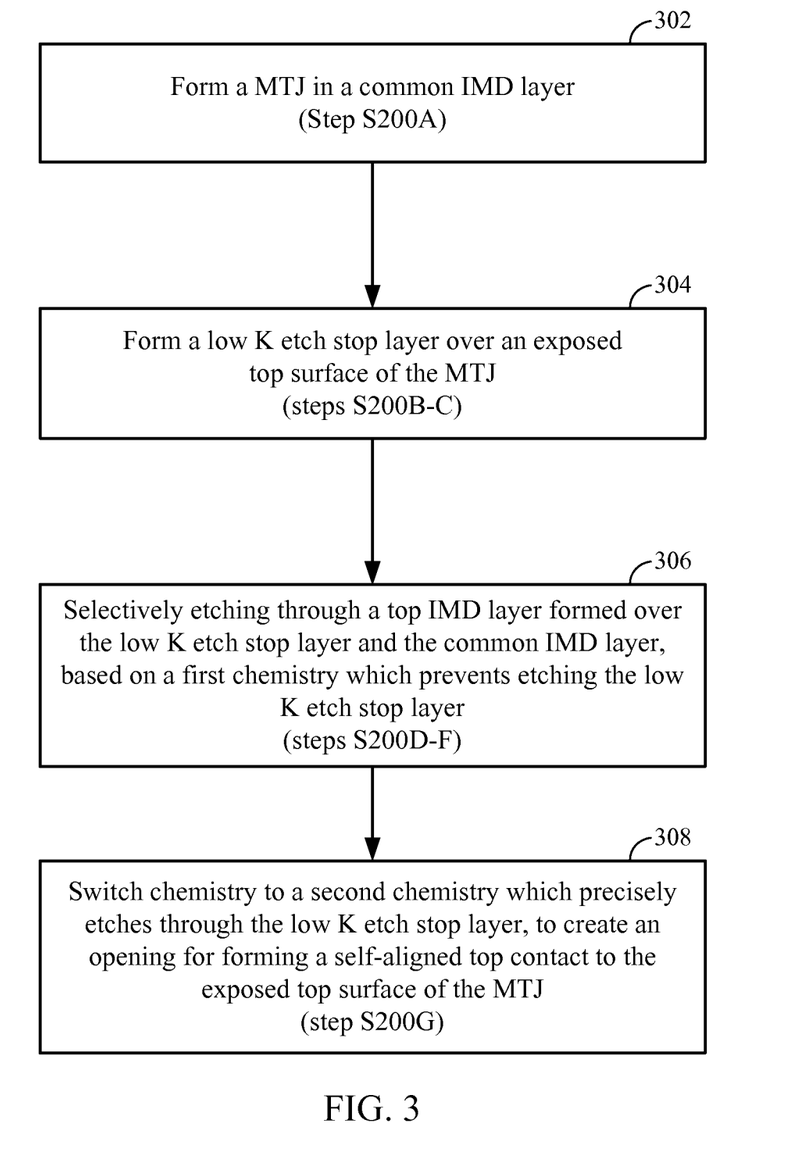
FIG. 3 illustrates a flowchart detailing an exemplary process of forming memory device 200 of FIGS. 2A-H.

It will be appreciated that embodiments include various methods for performing the processes, functions and/or algorithms disclosed herein. For example, as illustrated in FIG. 3, an embodiment can include a method of forming a top contact for a MRAM device (e.g., MRAM device 200), the method comprising: forming a MTJ (e.g., MTJ 202) in a common IMD layer (e.g., per step S200A)—Block 302; forming a low dielectric constant (K) etch stop layer (e.g., low K etch stop layer 218) over an exposed top surface of the MTJ (e.g., per steps S200B-C)—Block 304; selectively etching through a top IMD layer (e.g., top IMD layer 208t) formed over the low K etch stop layer and the common IMD layer, based on a first chemistry which prevents etching the low K etch stop layer (e.g., steps s200D-F)—Block 306; and switching chemistry to a second chemistry which precisely etches through the low K etch stop layer, to create an opening (e.g., opening 228m) for forming a self-aligned top contact to the exposed top surface of the MTJ (e.g., step s200G)—Block 308.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming self-aligned top contacts for MRAM devices. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of forming a top contact for a Magnetoresistive random-access memory (MRAM) device, the method comprising:

forming a magnetic tunnel junction (MTJ) in a common interlayer metal dielectric (IMD) layer;

forming a low dielectric constant (K) etch stop layer over an exposed top surface of the MTJ;

selectively etching through a top IMD layer formed over the low K etch stop layer and the common IMD layer, based on a first chemistry which prevents etching the low K etch stop layer; and switching chemistry to a second chemistry which precisely etches through the low K etch stop layer, to create an opening for forming a self-aligned top contact to the exposed top surface of the MTJ.

2. The method of claim 1, further comprising, forming a logic element in a logic side of the common IMD layer.

3. The method of claim 2, wherein the low K etch stop layer is selectively removed from the logic side prior to forming the top IMD layer over the low K etch stop layer.

4. The method of claim 2, further comprising etching through a cap layer formed below the common IMD layer, on the logic side, to expose a bottom metal line on the logic side, using the first chemistry.

5. The method of claim 4, further comprising performing metallization to form:
 a top metal line contact in the opening for forming the self-aligned top contact to the exposed top surface of the MTJ; and
 a via and top metal line contact to the exposed bottom metal line on the logic side.

6. The method of claim 5, wherein the metallization is performed by a copper dual damascene process.

7. The method of claim 1, wherein the MTJ comprises a hard mask layer, such that the self-aligned top contact is formed on an exposed top surface of the hard mask layer.

8. The method of claim 1, wherein the low K etch stop layer is formed from SiCN.

9. The method of claim 1, wherein the low K etch stop layer is formed from an insulating material.

10. The method of claim 1, wherein the low K etch stop layer is formed from nitrogen doped silicon carbide (nBlok).

11. The method of claim 1, wherein the first chemistry comprises C4F6 or C4F8 based chemistry with N2 and Ar mixed in.

12. The method of claim 1, wherein the second chemistry comprises Ch3F or CF4 based chemistry with N2 and Ar mixed in.

13. The method of claim 1, further comprising performing planarization to fill a planar dielectric around the MTJ, prior to etching through the top IMD layer.

14. A Magnetoresistive random-access memory (MRAM) device comprising:
 a magnetic tunnel junction (MTJ) formed in a common interlayer metal dielectric (IMD) layer with a logic element; and
 a low dielectric constant (K) etch stop layer formed selectively over the MTJ, but not the logic element, wherein a cap layer formed below the common IMD layer and the common IMD layer are configured to be etched by a first chemistry to expose a bottom metal line of the logic element, wherein the low K etch stop layer is configured to be etched by a second chemistry but not affected by the first chemistry used to etch the cap layer and the common IMD layer, and wherein a self-aligned top metal line contact for the MTJ is formed in an opening etched in the low K etch stop layer using the second chemistry.

15. The MRAM device of claim 14, wherein the MTJ comprises a hard mask layer, and the self-aligned top metal line contact is formed on an exposed top surface of the hard mask layer.

16. The MRAM device of claim 14, wherein the low K etch stop layer is formed from SiCN.

17. The MRAM device of claim 14, wherein the low K etch stop layer is formed from an insulating material.

18. The MRAM device of claim 14, wherein the low K etch stop layer is formed from nitrogen doped silicon carbide (nBlok).

19. A Magnetoresistive random-access memory (MRAM) device comprising:
 a magnetic tunnel junction (MTJ) formed in a common interlayer metal dielectric (IMD) layer with a logic element; and
 means for selectively preventing etching over the MTJ based on a first chemistry used for etching the common IMD layer, wherein a cap layer formed below the common IMD layer and the common IMD layer are configured to be etched by a first chemistry to expose a bottom metal line of the logic element, wherein the means is responsive to etching based on a second chemistry but not affected by the first chemistry used to etch the cap layer and the common IMD layer, and wherein a self-aligned top metal line contact for the MTJ is formed in an opening etched in the means, using the second chemistry.

* * * * *